United States Patent [19]
Reich et al.

[11] Patent Number: 5,270,558
[45] Date of Patent: Dec. 14, 1993

[54] INTEGRATED ELECTRONIC SHUTTER FOR CHARGE-COUPLED DEVICES

[75] Inventors: Robert K. Reich, North Chelmsford; Bernard Kosicki, Acton; Eugene D. Savoye, Concord, all of Mass.

[73] Assignee: Massachusetts Institute of Technology, Cambridge, Mass.

[21] Appl. No.: 24,805

[22] Filed: Mar. 1, 1993

Related U.S. Application Data

[63] Continuation of Ser. No. 801,876, Dec. 3, 1991, abandoned.

[51] Int. Cl.⁵ ............................................. H01L 29/796
[52] U.S. Cl. .................................... 257/223; 257/228; 257/231
[58] Field of Search ................... 357/24, 30; 257/222, 257/223, 228, 229, 231

[56] References Cited

U.S. PATENT DOCUMENTS

| | | | |
|---|---|---|---|
| 3,934,161 | 1/1976 | Caywood | 357/24 LR |
| 4,032,976 | 6/1977 | Levine | 357/24 |
| 4,040,092 | 8/1977 | Carnes | 357/24 |
| 4,131,810 | 12/1978 | Knauer et al. | 357/24 LR |
| 4,460,912 | 7/1984 | Takeshita et al. | 357/24 LR |
| 4,661,854 | 4/1987 | Savoye . | |
| 4,716,447 | 12/1987 | Savoye | 357/24 LR |
| 4,717,945 | 1/1988 | Yusa et al. | 357/24 LR |
| 4,831,453 | 5/1989 | Takemura | 358/213.19 |
| 4,839,734 | 6/1989 | Takemura | 358/213.22 |

OTHER PUBLICATIONS

Ishikawa et al, IT CCD Imaging Sensor with Variable Speed Electronic Shutter, SPIE vol. 1107 Infrared Dectors, Focal Plane Arrays and Imaging Sensors (1989) pp. 66–76.

Ikeda et al., CCD Camera Designed for Fast-Moving Scenes, JEE Mar. 1987, pp. 32–35.

Young et al., "Four-Frame gated optical imager with 120–ps resolution." Rev. Sci. Instrum. 59(8), Aug. 1988, pp. 1457–1460.

Esser, et al., "A Smearfree Accordion CCD Imager", WAM 1.5, 1988 IEEE, pp. 10–11.

Teranishi and Ishihara, "Smear Reduction in the Interline CCD Image Sensor," IEEE Transaction on Electron Devices, vol.ED-34 No. 5, May 1987, pp. 1052–1056.

Primary Examiner—Gene M. Munson
Attorney, Agent, or Firm—Robert F. O'Connell

[57] ABSTRACT

A charge-coupled device having an array of pixel elements formed in a substrate, which device is operable in a first state to expand the depletion well regions of each pixel element into the substrate for storing incoming photoelectrons therein and in a second state to contract the expanded depletion well regions to prevent storage of photoelectrons in the contracted depletion well regions.

12 Claims, 7 Drawing Sheets

INTEGRATED ELECTRONIC SHUTTER FOR CHARGE-COUPLED DEVICES

This is a continuation Ser. No. 07/801,876 filed on Dec. 3, 1991, now abandoned.

INTRODUCTION

This invention relates generally to electronic shutters used for a charge-coupled device (CCD's) and, more particularly, to a novel electronic shutter which is integrated into the structure of a back-illuminated, frame-transfer CCD for providing high speed operation and a reduction in smear which often occurs during image transfer from the CCD detection region to the image storage region of the device.

BACKGROUND OF THE INVENTION

High speed shuttering is needed in photodetector arrays to eliminate image blur caused by smear and/or to isolate optical pulses that are closely spaced in time. Eliminating image smear is important in high frame-transfer rate applications where the image transfer time is comparable to or greater than the image stare or integration time, since image smear under such conditions can significantly corrupt image information. Exemplary systems that require short exposure times and/or are sensitive to smear include high-speed photography systems, target tracking systems, range gating systems, and real-time adaptive optic systems.

Many frame-transfer photodetector arrays of the CCD type are operated so that the image integration time, i.e., the image exposure time, is substantially longer than the image transfer time so that image smear normally does not become a problem. Such an approach, however, severely restricts the use of these types of imaging systems and prevents their use in applications where it is desired to provide a high frame-transfer rate or a short-exposure time. Other solid state image sensors that include a shutter function often can be arranged to provide high frame-transfer rates or short-exposure times, but in doing so they often lose the ability to achieve a high pixel fill factor or require a relatively high degree of complexity and, hence, give rise to increased costs and difficulty in fabrication.

It is desirable to provide a CCD imaging system using a high-speed electronic shutter that can be specifically incorporated into the structure of the CCD, e.g., of a back-illuminated, frame-transfer CCD, to provide a device having a simpler structure that can be produced at reasonable costs. Such a device should be arranged to operate in a manner such that smear is substantially reduced, or eliminated, a high pixel fill factor (substantially at, or close to, 100%) is achieved, flexible integration times are made available, low-noise operation occurs, and near-reflection-limited quantum efficiencies over the visible spectrum can be simultaneously obtained. While other solutions to the problem of image smear, when the integration time is comparable to or less than the transfer time, have been proposed, none has been able to achieve such desired overall operation. For example, it has been suggested that image smear can be removed by performing post-processor data operations on the image data using suitably designed algorithms. Such an approach, however, is accomplished at the expense of time and increased hardware cost. Another proposed approach is to place an electro-optic shutter, such as a Pockel or Kerr cell, in front of the CCD. While such electro-optic shutters can have relatively fast switching times, e.g., on the order of nanoseconds, they suffer from other problems, such as requiring very high voltages for operations (i.e., often in the kilovolts range). They also tend to produce a relatively high (e.g. a 50%) loss of unpolarized light, are temperature sensitive, and tend to generate optic aberrations.

In still other approaches, electronic shutters have been proposed to be fabricated into a CCD structure by various methods. A typical example is an interline-transfer CCD wherein photoelectrons collected in photosensitive regions are transferred into the channel of an adjacent CCD at the end of an image capture operation. The adjacent CCD channel is covered by a blocking layer which prevents further collection of photoelectrons. In such a system, the image signal can be clocked out of the chip with reasonably negligible image smear. Shuttering by this technique requires only the time needed to transfer the charge from the photosite to the CCD channel (typically a single clock cycle). However, in such structures the pixel fill-factor is considerably reduced (i.e., well below 100%) because a significant portion of each pixel region has to be used by the CCD transfer channel.

An example of another approach is a frame-transfer CCD imaging system which shutters by transferring the entire image, i.e., all of the pixels thereof, from the imaging array into a frame-store array wherein the frame-store array is covered by an opaque material. Shuttering in this manner, however, creates a position-dependent-pixel image smear with the smear effect occurring and being most prominent for the pixels in the imaging array thereof that are positioned furthest from the frame-store array. The number of "smear" photoelectrons in such pixels is inversely proportional to the clock rate multiplied by the number of pixels in an imaging array column.

Still other CCD imagers create a shutter function by placing a photosensitive region over the CCD transfer channels. Such a method can provide pixel photosites with a high pixel fill-factor and can shutter the photoelectron signal relatively quickly. Unfortunately, however, the photosensitive layer causes other operating problems for the CCD, such as image lag, and the system has high operating voltage requirements and tends to produce relatively large and undesirable dark currents.

BRIEF SUMMARY OF THE INVENTION

This invention provides an electronic shutter developed to be integrally formed in back-illuminated, frame-transfer CCD imagers, the shutter being designed to provide fast switching times, a very high, i.e., effectively 100%, pixel fill-factor and high extinction ratios, while avoiding or minimizing the problems mentioned above that arise in other structures.

In accordance with the invention, a charge-coupled device which responds to an input optical signal includes an array of pixel elements which is formed in a substrate, each pixel element having a depletion well region. Means, operable in a first image exposure state (a shutter "open" state), are provided for expanding the depletion well regions of each of the pixel elements into the bulk region of the substrate. During such first state, substantially all of the incoming photoelectrons that are created by the input optical signal at each of the pixel elements are stored in the expanded depletion well regions. Further means, operable in a second storage state (a shutter "closed" state), are provided for contracting the depletion well regions of each of the pixel elements and for substantially preventing any further storage of photoelectrons in the contracted depletion well regions. Following the storage thereof, the stored photoelectrons can be readily transferred from the contracted depletion well regions to a frame storage array region. Such operation essentially eliminates smear, provides high speed shutter operation, and achieves a high extinction ratio, a high pixel fill factor, and a high speed data transfer rate. Such operation is obtained with a relatively simple structure that can be relatively easily fabricated at reasonable cost.

DESCRIPTION OF THE INVENTION

The invention can be described more clearly with the help of the accompanying drawings wherein FIG. 1 shows a top view of a frame-transfer CCD device in accordance with the invention;

Figure 1:
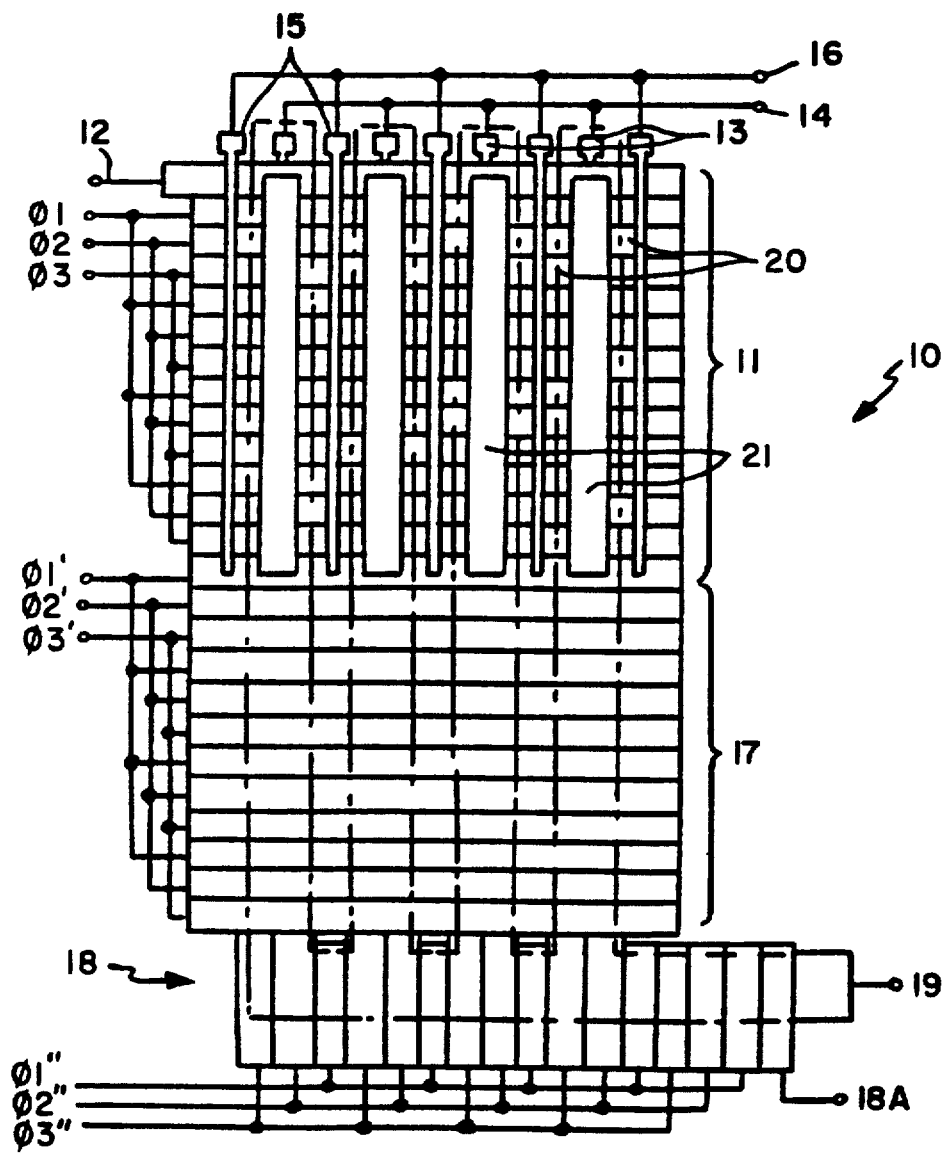

FIG. 1 shows a top diagrammatic view of a frame-transfer CCD device 10 which includes a three-phase imaging array 11 of pixel elements having appropriate terminals for three-phase inputs $\phi 1$, $\phi 2$ and $\phi 3$ and an input gate terminal 12, as would be well-known to those in the art. Input diodes 13 of each pixel are connected to an input diode electrode 14, while shutter drain regions 15 between each pixel have a shutter drain electrode 16 connected thereto as shown. A frame store array 17 is formed adjacent to the imaging array 11 into which array 17 charges for a complete frame, which are stored in each of the pixels of the imaging array 11, can be transferred, in accordance with well-known frame-transfer CCD operation. Conventional three-phase control inputs $\phi 1'$, $\phi 2'$ and $\phi 3'$ are also provided at the frame store array 17. The frame data stored in array 17 can be then clocked out from the frame store to an output register 18 and supplied therefrom to an output gate 18A and to a video output terminal 19 using the appropriate three-phase clocking signals $\phi 1''$, $\phi 2''$ and $\phi 3''$, associated with output register 18. Suitable channel stop regions 20 are formed between each vertical group 21 of charge transfer channels, as also would be well-known to those in the art familiar with the general structure and operation of frame transfer CCD devices.

Figure 2:
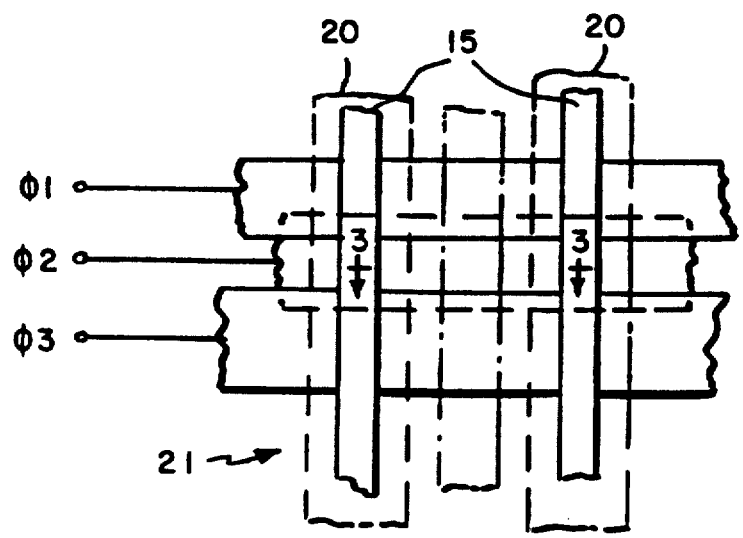
FIG. 2 shows a top view of an exemplary pixel element in the device of FIG. 1.
Figure 3:
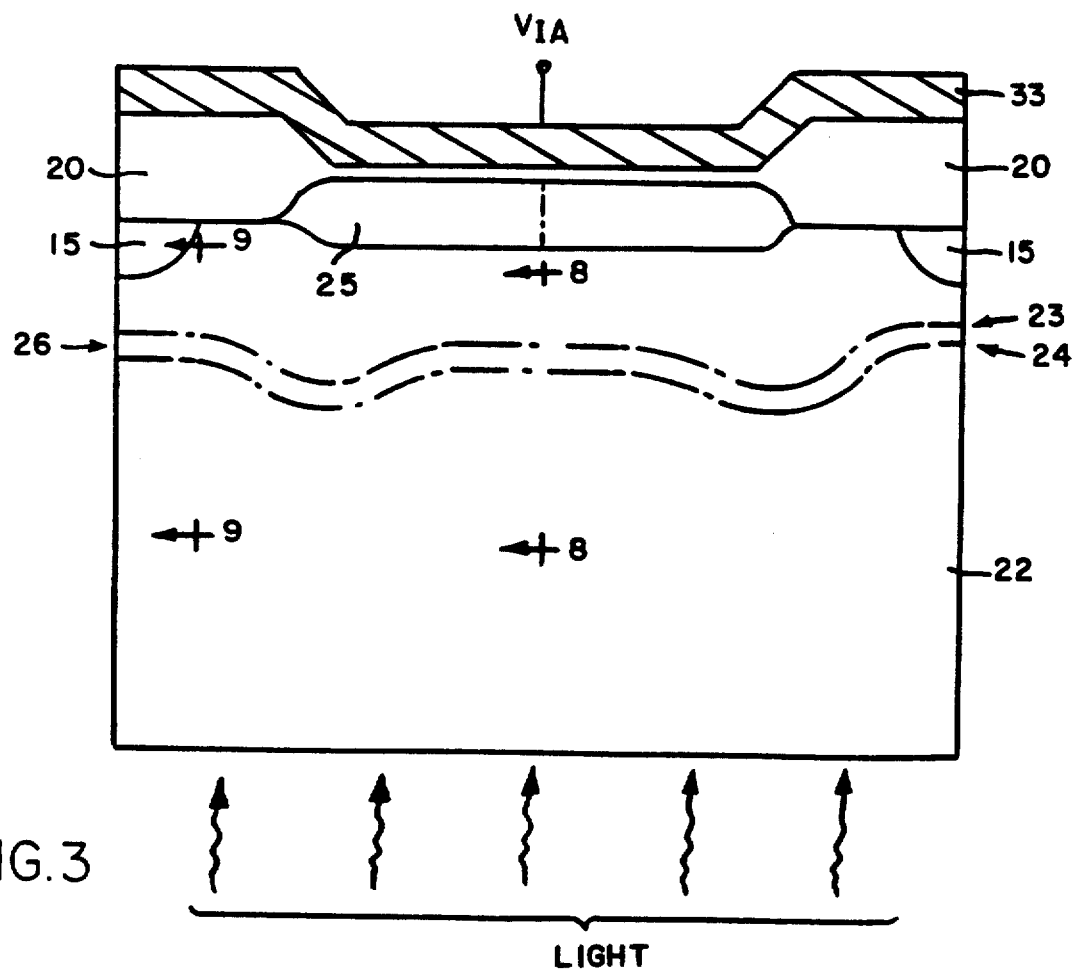
FIG. 3 shows an enlarged view in section of a portion of the exemplary pixel element of FIG. 2 along the line 3—3.

FIG. 2 shows a top view of an single exemplary, back-illuminated pixel element in the imaging array 11 of the n-channel frame-transfer CCD device 10 of FIG. 1, which device, as discussed in more detail below, includes an electronic shutter in accordance with the invention. FIG. 3 shows a side view of the pixel element of FIG. 2 along the line 3—3 thereof. As can be seen therein, each pixel element is formed in a p-type semiconductor material substrate 22 such as a p-type silicon substrate. The structure shown therein is generally a standard frame-transfer pixel structure except for the integrally formed electronic shutter structure which is integrally formed therein. Such shutter includes n+ shutter drain regions 15 positioned between the vertical transfer channels in the imaging array and a stepped p-type buried layer 26. The p-type buried layer 26 extends across the pixel, the depth thereof varying between a first depth 23 and a second depth 24, as shown in FIG. 3. The portion of p-type buried layer 26 at its first depth is generally centered beneath both the n+ buried channel 25, which serves as the collection portion of the pixel and the shutter drain regions 15, while the portion of p-type buried layer 26 in between, i.e., at its second depth, functions as a storage region for charges previously collected.

Figure 8:
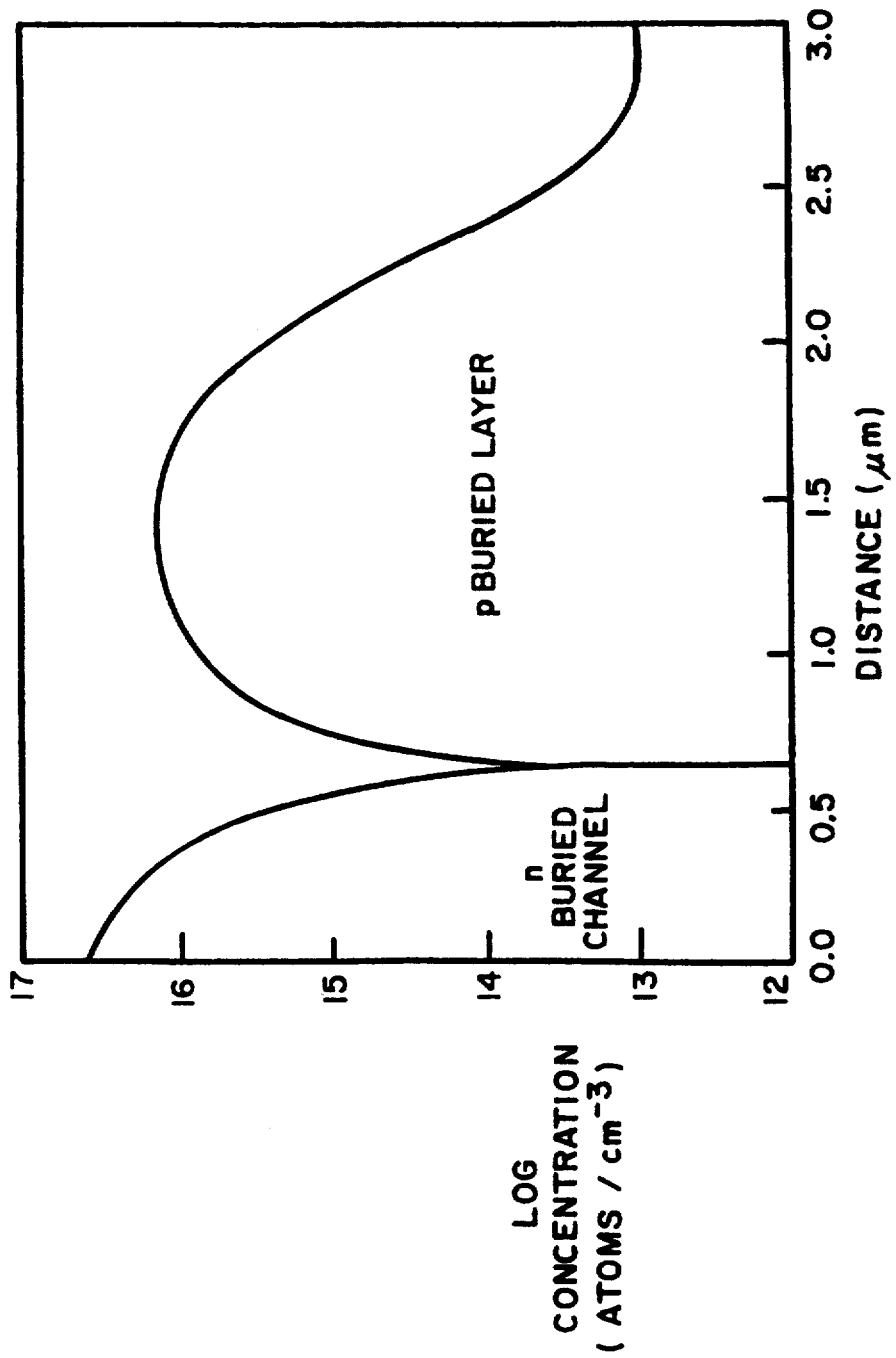
FIG. 8 shows typical exemplary impurity concentrations of certain regions of a device of the invention.
Figure 9:
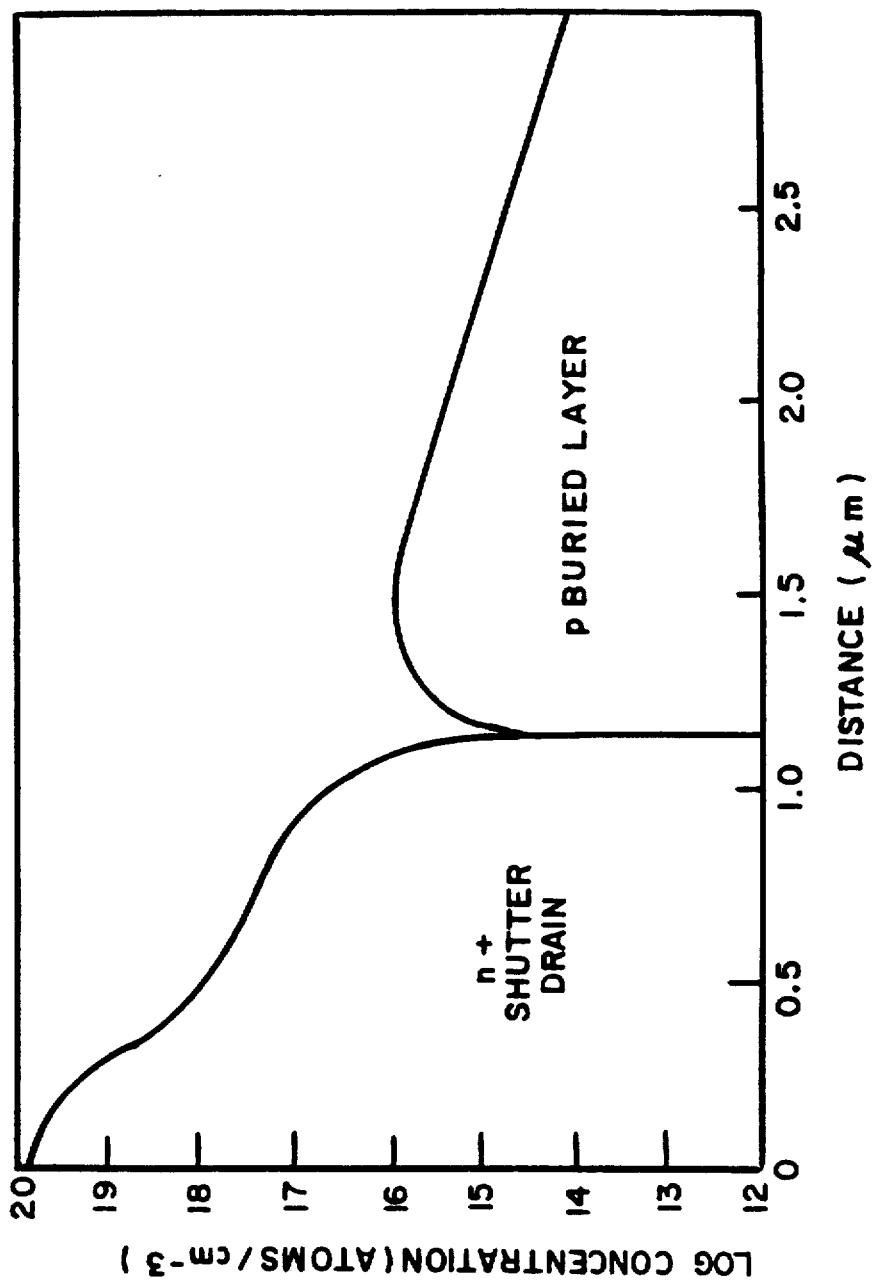
FIG. 9 shows typical exemplary impurity concentrations of certain other regions of the invention.

FIGS. 8 and 9 show typical curves depicting the impurity concentrations for the regions of the typical pixels shown in FIGS. 2 and 3. FIG. 8 depicts the Log Concentration as a function of depth taken along a line 8—8 of FIG. 3 for the n-buried channel region 25 and the p-buried layer region 22 at the center of the pixel. FIG. 9 depicts the Log Concentration as a function of depth taken along a line 9—9 of FIG. 3 for the n shutter drain region 15 and the p-buried layer region 22 at the left of the pixel.

Figure 4:
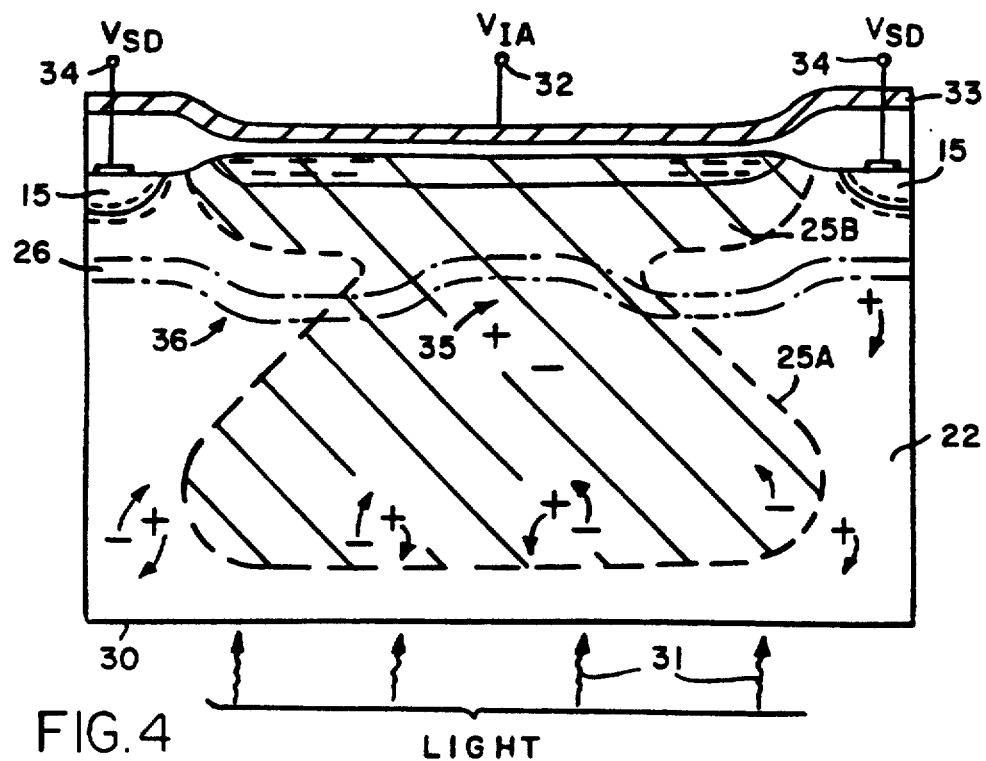
FIG. 4 shows a view in section of an exemplary pixel element of the device of FIGS. 1-3 in a shutter "open" state.
Figure 5:
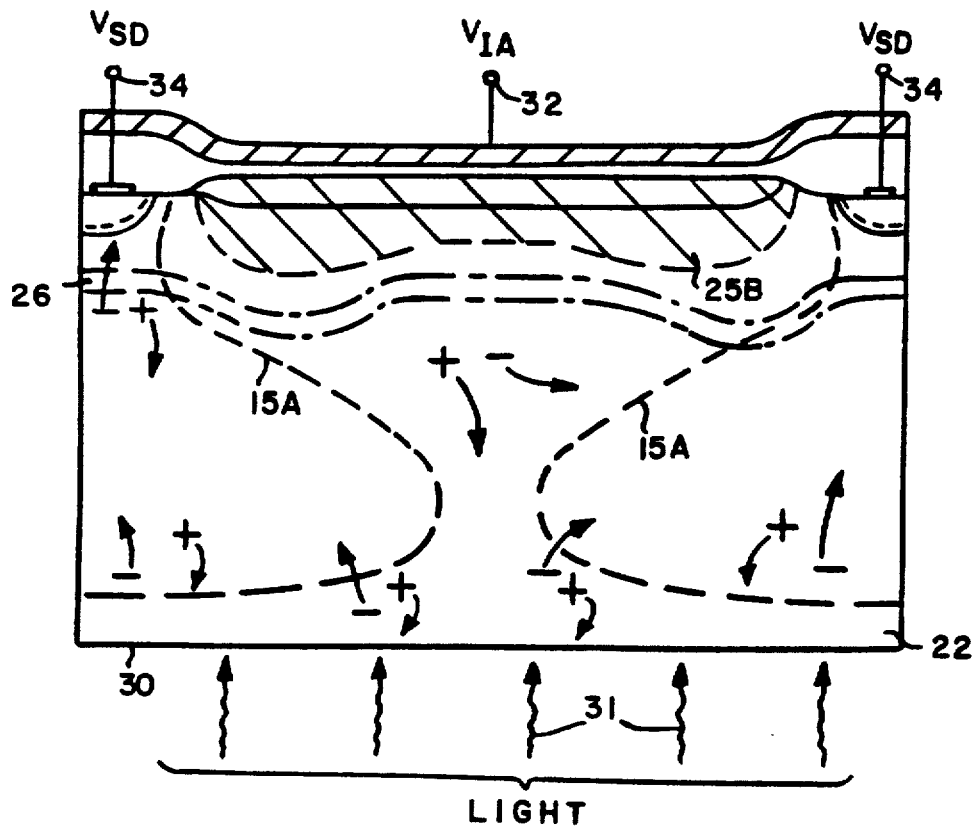
FIG. 5 shows a view in section of an exemplary pixel element of the device of FIGS. 1-3 in a shutter "closed" state.

Operation of the device of FIGS. 1-3 can be best described with the help of FIGS. 4 and 5 which depict the shutter "open" (FIG. 4) and shutter "closed" (FIG. 5) operating modes, respectively, for a typical pixel element.

When the shutter is in its open mode it is desirous that all of the photoelectrons from an incoming light image be captured, which light image illuminates the back surface 30 of the substrate 22 at each pixel, as depicted by the wavy arrows 31. In such mode, photoelectrons are collected in the n-type channel depletion region 25 formed in the substrate. For such purpose, during the image capture, shutter-open, mode, a voltage $V_{IA}$ having a suitably selected value is applied to an imaging-array clock electrode 32 at the gate electrode region 33 (which electrode is connected to each of the pixels as shown in FIG. 4). When the voltage $V_{IA}$ is so applied, the n-type buried channel depletion region 25 (See FIG. 3) expands to form an expanded n-type buried channel depletion region 25A which extends from the gate dielectric region through the p-type buried layer 26 (shown in phantom in FIG. 4) into the bulk region of the low-doped p− substrate. A voltage $V_{SD}$ is applied via shutter drain electrode 34 to each pixel as shown in FIG. 4 to keep the junction thereat reverse biased. Voltage $V_{SD}$ is such that it does not cause depletion of the drain regions through the p-type buried layer 26. Photoelectrons (i.e. negative charges) created by the optical signal entering the substrate are attracted at each pixel, by the electric field established by voltage $V_{IA}$, to the expanded n-type buried channel depletion region 25A in which the charges are then stored. The undepleted region of the p-type buried layer 22 creates an electric field that tends to repel the photoelectrons away from the shutter drain regions 15.

Accordingly, photoelectrons enter the n-type buried depletion channel 25A from the p⁻ substrate through the region 35 of the more shallow depth portion of the p-type buried layer 26 near the center of the pixel. A potential barrier, similar to that for the n+ shutter drain, stops photoelectrons from directly entering the n-type buried channel region above regions 36 of the deeper portions of the p-type buried layer 26. The potential well in the n-type buried channel adjacent to the deeper p-type buried layer regions 36 is more positive than that adjacent to the more shallow region 35 thereof. As a result, the electrons that migrate to the more shallow p-type buried layer portion 35 are transferred to the n-type buried channel storage depletion region 25B that is above that portion of the p-type buried layer 26. The depletion region 35 under the central, collection part of the pixel is insensitive to the number of photoelectrons that have been captured, up to some maximum amount, i.e., the expansion stays constant. Additional photoelectrons beyond this maximum are shared between such storage depletion region and the collection depletion region below p-type buried layer 26 of the pixel, causing a gradual collapse of the overall depletion region.

When the electronic shutter is closed (FIG. 5) a voltage $V_{IA}$ having a different selected value is applied to the imaging-array electrode 32, which voltage has a lower value than when the shutter is opened and is not sufficient to cause depletion region 25 to expand and deplete through the p-type buried layer 22 so that the depletion region 25A contracts to the region 25B as shown. Such voltage, however, is adequate to permit transfer of charges from pixel to pixel. During the shutter closed mode, a potential barrier between the contracted n-typed buried channel region 25B and the p⁻ substrate is created by the p-type buried layer 26. This barrier has an associated electric field that repels photoelectrons away from the contracted n-type buried channel 25B. During the shutter closed mode, the voltage $V_{SD}$ applied to the n+ shutter drains is greater than that applied during the shutter open mode and causes the drain depletion region 15 to expand beyond the p-type buried layer deeper into the bulk region of the p⁻ substrate, as shown by region 15A in FIG. 5. Under such conditions, photoelectrons (negative charges) are attracted, by the electric field that is established thereat, to the expanded shutter drain regions 15A and, as a result, are not detected or collected in the contracted n-type buried channel region 25.

In summary, when the shutter is open, the expanded n-type buried channel depletion region 25A at each pixel tends to capture substantially all of the photoelectrons from the incoming optical image which impinge thereon and to store them in the depletion region 25B thereof. The p-type buried layer 26 tends to prevent such incoming photoelectron charges from being attracted to the drain regions so that essentially all of the charges entering each pixel are captured (in effect, providing a 100% pixel fill factor) when the shutter is in its open mode.

During the shutter closed mode, the contracted n-type buried channel region retains the charges that have been so captured when the shutter was open but no further incoming charges are captured therein, any further charges being prevented from entering n-type buried channel region 25B by the p-type buried layer 26, such further incoming charges further being drained from the substrate via expanded drain depletion regions 15A.

The overall shutter operation produces a rapidly operating shutter which has a high extinction ratio such that substantially all incoming photoelectron charges are stored when open and substantially no charges are stored when closed. The stored charges can then be transferred from the n-type buried channel region 25 of each pixel to corresponding frame store regions of array 17 without smear using well-known frame transfer techniques of the art.

Unlike previously proposed shutter systems which require high voltages for their operations, the system described herein uses relatively low voltages at the electrodes 32 and 34. Thus, during the shutter open mode, the voltages $V_{IA}$ are such that 18 v. $\leq V_{IA} \leq$ 25 v., while the voltage $V_{SD}$ is such that 0 v. $\leq V_{SD} \leq$ 6 v. During the shutter closed mode the voltage are such that −6 v. $\leq V_{IA} \leq$ 12 v. and 6 v. $\leq V_{SD} \leq$ 18 v.

It is found that for such operation, extinction ratios increase with decreasing wavelength. Extinction ratios for three exemplary wavelengths in an experimental device fabricated in accordance with the invention were found as follows:

| (nm.) | Extinction Ratio |
|---|---|
| 450 | >5500 |
| 543.5 | 5100 |
| 632.8 | 107 |

As seen in the above table, for wavelengths of less than about 540 nm. the extinction ratio is higher than 5,000, while at a wavelength of 450 nm., the ratio was higher than could be measured by the experimental set-up used.

Figure 6:
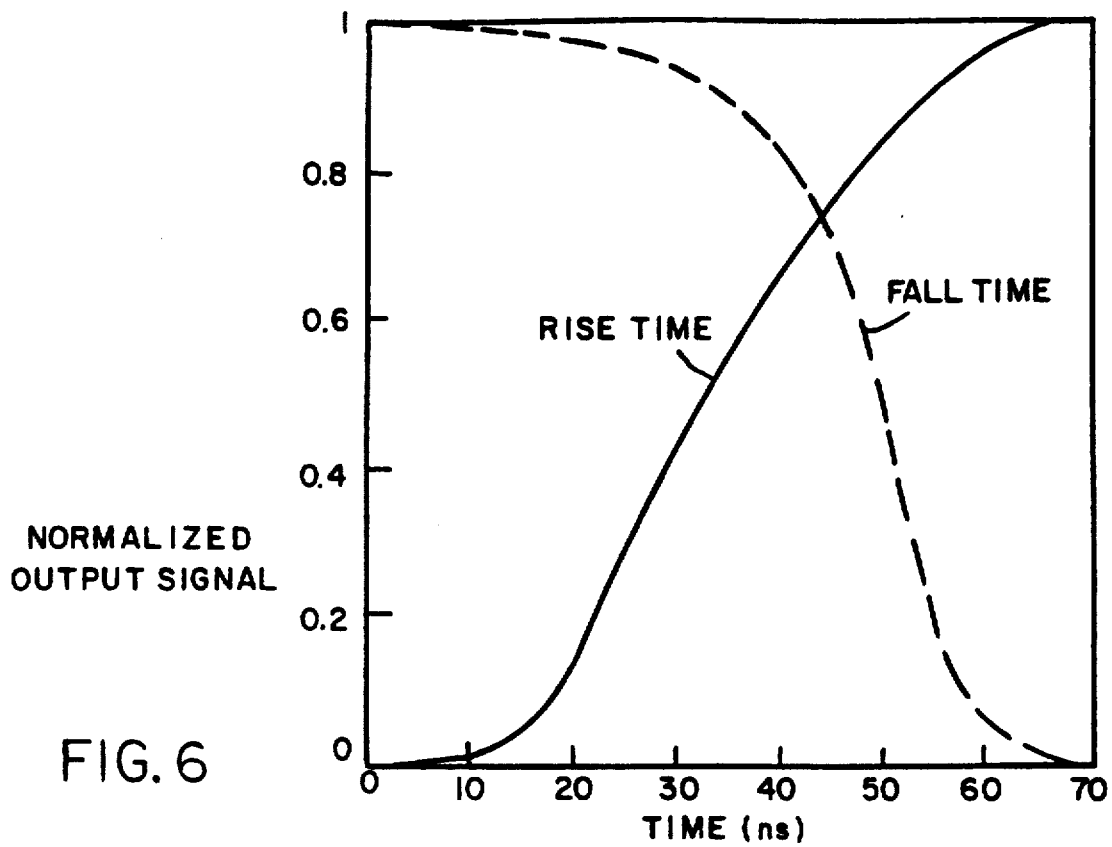
FIG. 6 shows a normalized, measured CCD output signal as a function of time for shutter rise and fall regions of a typical device of the invention.

Shutter rise and fall times of a typical embodiment of the invention were measured by stepping a pulse of light in time through the shutter transition regions (i.e., when going both from a closed to an open mode and from an open to closed mode) and recording the CCD output response versus the time steps. A shutter function, S(t), representing the intrinsic shutter speed, can be defined as the fraction of the photoelectrons detected out of the total number of photoelectrons present, assuming the extinction ratio is infinite. The CCD output response O(t) can be represented as the convolution of the shutter function S(t) with a photoelectron pulse input I(t) and is written as O(t)=S(t)*I(t). FIG. 6 depicts a normalized, measured CCD output signal as a function of time for shutter rise and fall operations and shows that the switching times are less than 55 ns taken between the 10% to 90% values.

Figure 7:
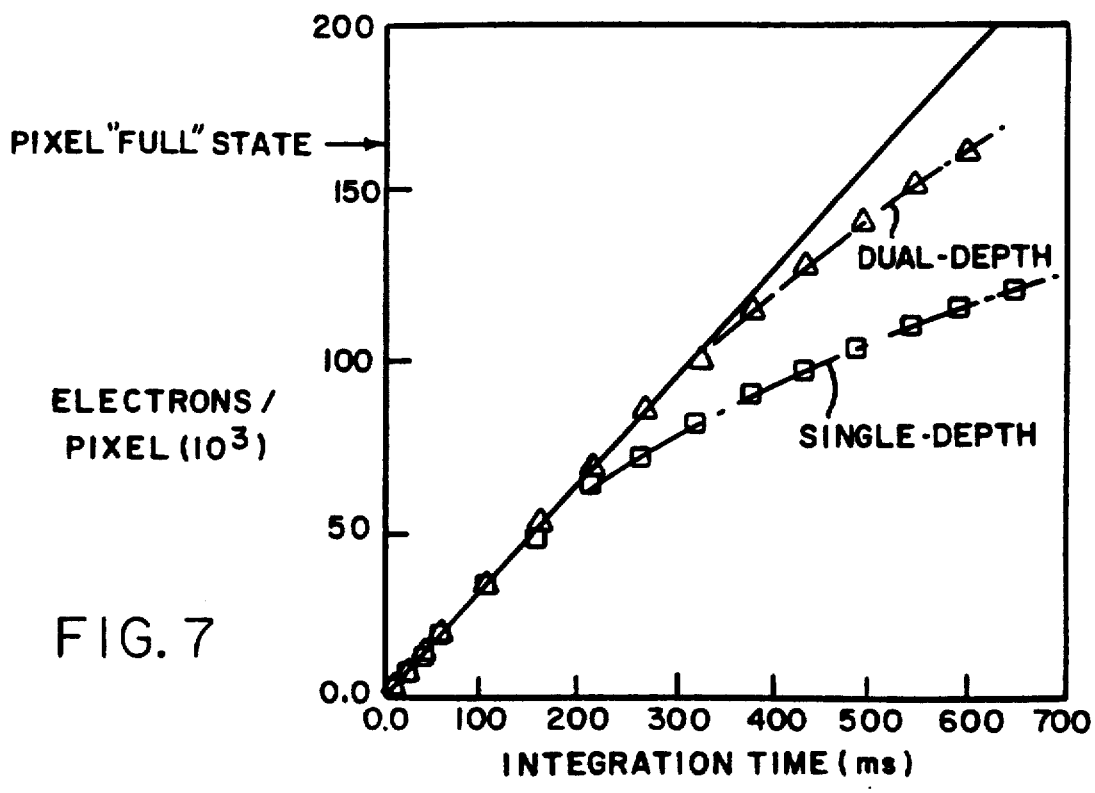
FIG. 7 shows the pixel response as a function of shutter integration time in a typical device of the invention.

The use of the stepped, or dual-depth, p-type buried layer 26 permits the use of an n-type buried depletion region that is independent of the signal accumulated in the well up to some maximum amount. FIG. 7 shows the pixel response (i.e. the number of electrons captured per pixel) versus the integration time (i.e., shutter open time) for such a dual-depth p-type buried layer 26 (see triangle points in FIG. 7) as contrasted with the use of a single depth level p-type buried channel (see square points in FIG. 7). For such operation the shutter drain was biased so that the expanded n-type buried depletion region 25A went through and slightly beyond the p-type buried layer in each case. As long the depletion region associated with the detection area remains constant, the pixel response should have a generally linear dependence on integration time (as in the solid line of FIG. 7). The results in FIG. 7 show that the pixel response for the dual-depth p-type buried layer remains linear up to about two-thirds of the pixel "full" state, as noted in the figure, while the single-depth p-type buried layer becomes non-linear at relatively lower signal levels.

Thus, in accordance with the invention, an electronic shutter is successfully integrated into the structure of a frame-transfer, back-illuminated CCD image device. The electronic shutter has high extinction ratios, e.g., greater than 5000 for wavelengths shorter than 540 nm, and can be effectively switched in very short times, e.g., less than about 55 ns.

Further, the use of a stepped, or dual-depth, p-type buried layer as described therein results in a substantially linear response up to a substantial fraction of the pixel "full" condition by creating pixels that have separate photoelectron collection and storage regions.

Figure 10:
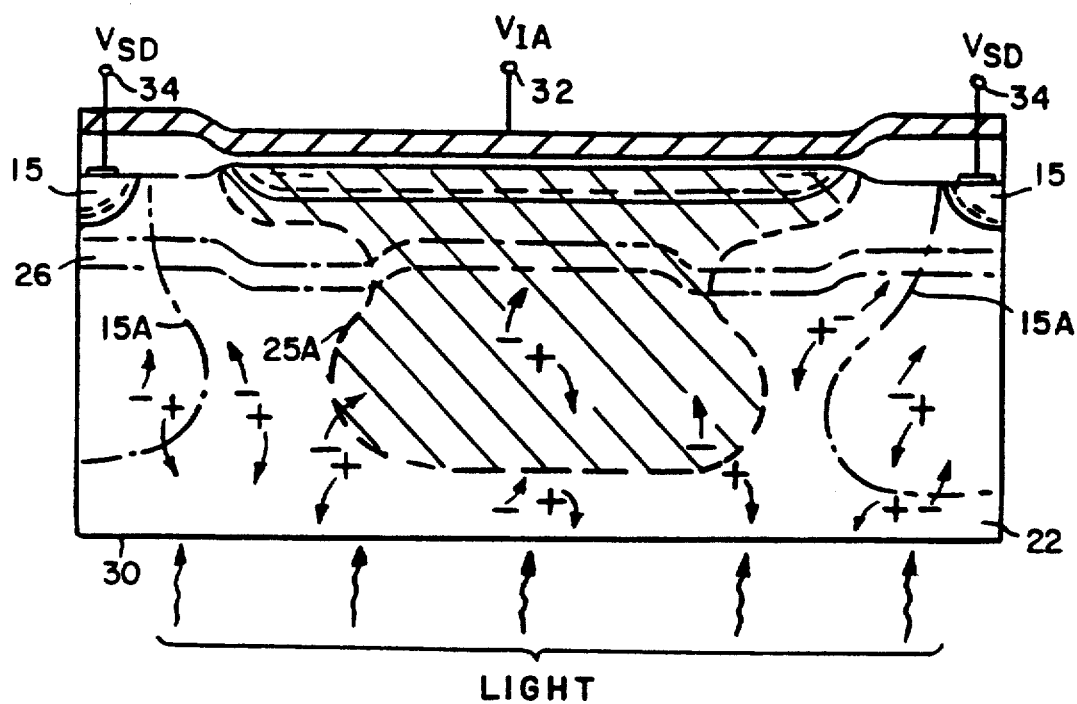
FIG. 10 shows a view in section of an exemplary pixel element of the device of FIGS. 1-3 as used in an "iris" mode of operation.

In addition to operating a device in accordance with the invention as an electronic shutter, such a device can also be operated in the manner of a voltage controlled iris. For such operation, both the depletion regions 15A associated with the n+ shutter drains and the depletion region 25A associated with the n-type buried channel expand beyond the p-type buried layer 26 and into the p-substrate 22, as shown in FIG. 10. Each shutter drain region and n-type buried channel region is collecting a portion of the photo electrons (charges) from the incoming light signal. The fraction of photo electrons collected by n-type buried channel collection region 25A can be decreased by increasing the shutter drain voltages $V_{SD}$ or by decreasing the imaging array gate electrode voltage $V_{IA}$. The increase in shutter drain voltages causes its depletion region 15A to extend further into the substrate 22 and closes the iris by creating an electric field which attracts more of the photo electrons away from the n-type buried channel region 25A and to the n+ shutter drains 15. The shutter drains remove a greater fraction of the total number of input signal photo electrons present as the shutter drain voltage increases. Thus, fewer of the input signal photo electrons are collected by the n-type buried channel detection region 25A. Accordingly, the iris opening can be controlled by controlling the values of either the $V_{IA}$ or $V_{SD}$ voltages, or a combination of both.

Using the electronic shutter in such an "iris" mode of operation, for example, allows adequate contrast to be maintained, particularly under highly illuminated imaging conditions, e.g., a very bright incoming signal. Conventional optical detector arrays without the ability to provide such iris control tend to lose contrast at high input signal levels because the pixels saturate, i.e., all pixels become substantially the same level, resulting in an image with little or no texture, i.e., effectively a blank white screen.

While the particular embodiments of the invention described above represent preferred embodiments thereof, modifications may occur to those in the art within the spirit and scope of the invention. Hence, the invention is not to be construed as limited to the particular embodiments disclosed herein, except as defined by the appended claims.

What is claimed is:

1. A charge-coupled device having an array of pixel elements formed in a substrate of a specified carrier type, each pixel element having a depletion well region, said array being responsive to an input optical signal, said device including
   means, operable in a first state, for expanding the depletion well regions of each of said pixel elements into the substrate for storing in said expanded depletion well regions incoming photoelectrons created by said input optical signal at each said pixel element;
   means, operable in a second state, for contracting the expanded depletion well regions of each of said pixel elements; and
   buried barrier layer means, having a carrier type the same as that of said substrate and having a higher dopant concentration than that of said substrate, formed in said substrate for assuring that substantially all of the incoming photoelectrons created by said input optical signal at each said pixel region are stored in said expanded depletion well regions in said first sate and for substantially preventing the storage in said contracted depletion well regions of any incoming photoelectrons created by said input optical signal at each said pixel region in said second state.

2. An electronic shutter for use in a charge-coupled device having an array of pixel elements formed in a semiconductor substrate, said array being responsive to an input optical signal and each pixel element having a gate electrode at the surface of said substrate, said shutter comprising
   a depletion well region formed at each pixel element;
   a plurality of drain depletion regions each formed between adjacent pixel elements of said array thereof;
   a buried layer formed at each pixel element beneath the depletion well region and the drain depletion regions thereof;
   first voltage means for supplying a first voltage to the gate electrodes at each said pixel element during a shutter open mode for producing an expanded depletion well region which extends into the bulk region of said substrate beneath the buried layer of each pixel element;
   second voltage means for supplying a second voltage to the drain depletion regions between said pixel elements for providing a reverse voltage bias between said drain depletion regions and the buried layer at each said pixel element;
   wherein, during said shutter open condition, photoelectrons supplied to said substrate from said input optical signal at each said element are stored in said expanded depletion well region thereof, said buried layer preventing said photoelectrons from migrating to said drain depletion regions.

3. An electronic shutter in accordance with claim 2 wherein, during a shutter closed mode,
   said first voltage means supplies a third voltage to the gate electrodes at each said pixel element for contracting said expanded depletion well region to a substantially smaller contracted depletion well region above said buried layer; and
   said second voltage means supplies a fourth voltage to the drain depletion regions between said pixel elements for causing said drain depletion regions to expand into the bulk region of said substrate beneath said buried layer at each said pixel element;
   whereby, during said shutter closed mode, any photoelectrons supplied to said substrate at each said pixel element are attracted to said expanded drain depletion regions and are prevented from migration to said contracted depletion well region.

4. An electronic shutter in accordance with claims 2 or 3 wherein portions of said buried layer are at a first depth and other portions of said buried layer are at a second depth greater than said first depth beneath said depletion well region and said drain depletion regions.

5. An electronic shutter in accordance with claim 4 wherein the portions of said buried layer at said first depth are under the center region of said depletion well region and other portions at said first depth are under said drain depletion regions, said portions of said buried layer at said second depth being under regions between said center region and said drain depletions regions.

6. An electronic shutter in accordance with claim 3 wherein said third voltage has a value between about −6 v. and about 12 v. and said fourth voltage has a value between about 6 v. and about 18 v.

7. An electronic shutter in accordance with claim 2 wherein said first voltage has a value between about 18 v. and about 25 v. and said second voltage has a value between about 0 v. and about 6 v.

8. An electronic shutter in accordance with claim 2 wherein said substrate comprises a p-type buried layer, said depletion well region comprises an n-type depletion channel, and said drain depletion regions are n-type drain channels.

9. An electronic shutter in accordance with claim 8 wherein said p-type buried layer has an impurity concentration such that the log concentration thereof lies within a range from about 12 atoms/cm$^3$ to about 16 atoms/cm$^3$, said n-type depletion channel has an impurity concentration such that the log concentration thereof lies within a range from about 12 atoms/cm$^3$ to about 16.5 cm$^3$, and said n-type drain channels each have an impurity concentration such that the log concentration thereof lies within a range from about 12 atoms/cm$^3$ to about 20 atoms/cm$^3$.

10. An electronic iris for use in a charge-coupled device having an array of pixel elements formed in a semiconductor substrate, each pixel element having a gate electrode at the surface of said substrate, said iris comprising
    a plurality of drain depletion regions each formed between adjacent pixel elements of said array thereof;
    a buried layer formed at each pixel element beneath the depletion well region and the drain depletion regions thereof;
    first voltage means for supplying a first voltage to the gate electrodes at each said pixel element for producing an expanded depletion well region which extends into the bulk region of said substrate beneath the buried layer of each pixel element;
    second voltage means for supplying a second voltage to the drain depletion regions between said pixel elements for causing said drain depletion regions to expand into the bulk region of said substrate beneath the buried layer at each said pixel element;
    wherein at least said first or said second voltage means are controlled so as to control the portion of the photoelectrons supplied to said substrate from said input optical signal at each said element that are stored in said expanded depletion well region.

11. An iris in accordance with claim 10 wherein said second voltage means is controlled so as to control the extent to which said drain depletion regions expand into the bulk region of said substrate so as to control the portion of the photoelectrons supplied to said substrate from said input optical signals that are stored in said expanded depletion well region.

12. An iris in accordance with claim 10 wherein said first and said second voltage means are controlled so as to control the extent to which said depletion well region and said drain depletion regions expand, respectively, into the bulk region of said substrate so as to control the portion of the photoelectrons supplied from said input signal that are stored in said expanded depletion well region.

* * * * *

UNITED STATES PATENT AND TRADEMARK OFFICE
CERTIFICATE OF CORRECTION

PATENT NO.   :   5,270,558

DATED        :   December 14, 1993

INVENTOR(S)  :   Robert K. Reich, Bernard Kosicki, Eugene D. Savoye

It is certified that error appears in the above-identified patent and that said Letters Patent is hereby corrected as shown below:

Column 1, after the Title, insert --This invention was made with government support under Contract No. F19628-90-C0002 by the Air Force. The government has certain rights in the invention--.

Signed and Sealed this

Ninth Day of August, 1994

Attest:

BRUCE LEHMAN

*Attesting Officer*      *Commissioner of Patents and Trademarks*